United States Patent
Park et al.

(10) Patent No.: US 7,296,200 B2
(45) Date of Patent: Nov. 13, 2007

(54) SOC-BASED CORE SCAN CHAIN LINKAGE SWITCH

(75) Inventors: Chang Won Park, Suwon (KR); Ki Man Jeon, Seongnam (KR); Sung Ju Park, Ansan (KR); Kyeong Won Yeom, Kunpo (KR); Tae Sik Kim, Seoul (KR)

(73) Assignee: Korea Electronics Technology Institute, Pyung Taek-si (KR)

( * ) Notice: Subject to any disclaimer, the term of this patent is extended or adjusted under 35 U.S.C. 154(b) by 137 days.

(21) Appl. No.: 10/995,099

(22) Filed: Nov. 24, 2004

(65) Prior Publication Data

US 2005/0149797 A1    Jul. 7, 2005

(30) Foreign Application Priority Data

Dec. 2, 2003    (KR) ................ 10-2003-0086700

(51) Int. Cl.
*G01R 31/28*    (2006.01)
(52) U.S. Cl. .................. 714/724; 714/25; 714/726; 714/727; 714/729; 710/100
(58) Field of Classification Search ............. None
See application file for complete search history.

(56) References Cited

U.S. PATENT DOCUMENTS

| | | | |
|---|---|---|---|
| 6,324,614 B1 * | 11/2001 | Whetsel | 714/726 |
| 6,324,662 B1 * | 11/2001 | Haroun et al. | 714/724 |
| 6,425,100 B1 * | 7/2002 | Bhattacharya | 714/724 |
| 6,425,101 B1 * | 7/2002 | Garreau | 714/727 |
| 6,560,734 B1 * | 5/2003 | Whetsel | 714/724 |
| 6,760,874 B2 * | 7/2004 | Cote et al. | 714/724 |
| 2002/0046375 A1 * | 4/2002 | Haroun et al. | 714/727 |
| 2003/0126533 A1 * | 7/2003 | McAdams | 714/727 |

OTHER PUBLICATIONS

Benabdenebi et al., "CAS-BUS: A Scalable and Reconfigurable Test Access Mechanisms for Systems on a Chip", Mar. 27-30, 2000, IEEE Design Automation and Test in Europe Conference 2000, pp. 141-145.*

* cited by examiner

*Primary Examiner*—Guy Lamarre
*Assistant Examiner*—John P Trimmings
(74) *Attorney, Agent, or Firm*—Sughrue Mion Pllc.

(57) ABSTRACT

Disclosed herein is an SoC-based core scan chain linkage switch. The core scan chain linkage switch includes test bus terminals, scan chain input/output terminals, a switch unit and SCLK, UCLK, Mode and Enable signals. The test bus terminals apply instructions and input/output test data. The scan chain input/output terminals link with the scan chains of an embedded core. The switch unit completes a linkage configuration between the test bus terminals and the scan chain input/output terminals in response to the applied instructions. The SCLK, UCLK and Mode signals apply the instructions to dynamically reconfigure the switch unit and update the linkage configuration of the switch unit, and the Enable signal activates and deactivates the switch unit.

2 Claims, 2 Drawing Sheets

SOC-BASED CORE SCAN CHAIN LINKAGE SWITCH

RELATED APPLICATIONS

The present disclosure relates to subject matter contained in priority Korean Application No. 10-2003-0086700, filed on 2 Dec. 2003, which is herein expressly incorporated by reference in its entirety.

BACKGROUND OF THE INVENTION

1. Field of the Invention

The present invention relates generally to a system-on-a-chip-based scan chain linkage switch and, more particularly, to a test access mechanism (TAM) that facilitates the various dynamic tests by guaranteeing reconfiguration capability while minimizing the hardware overhead of the test access configuration of intellectual property cores embedded in a system-on-a-chip.

2. Description of the Related Art

As the degree of integration of a chip rapidly increases recently with the help of the development of semiconductor technology, a System-on-a-Chip (SoC) in which a system composed of cores, such as a processor and memory, is implemented in a single chip is widely used. The period of design is considerably reduced using reusable Intellectual Property (IP) cores, but a test and verification process causes a principal bottleneck in SoC design, so that various test technologies for the cores of the SoC have been developed.

In general, the important components of a test access configuration for an SoC composed of IP cores include a TAM and a test wrapper. The TAM includes a scan chain and a Built-In Self-Test (BIST) for inputting core internal test patterns. It is difficult to standardize the TAM.

A conventional Core Access Switch (CAS)-BUS, which was disclosed in the thesis "CAS-BUS: a scalable and reconfigurable test access mechanism for systems on a chip," Design, Automation and Test in Europe Conference, Proceedings, pp. 141-145, 2000, by M. Benabdenebi, W. Maroufi and M. Marzouki, was proposed for test access to an SoC composed of heterogeneous cores. However, the structure of the CAS is complicated, so that the actual application of the CAS-BUS to a system chip incurs high costs.

FIG. 1 is an example of various test functions that can be performed by the conventional CAS-BUS. Referring to FIG. 1, one CAS is required for one core, an SoC test controller is used, and various test functions, such as core internal and external tests, a BIST and a hierarchical core test, are provided.

FIG. 2 is a configuration diagram showing the linkage of a CAS to an IP core surrounded by a P1500 wrapper. As shown in FIG. 2, the CAS is a switch that links P lines from N test bus terminals to scan chain input terminals and links P core scan chain output terminals to the test buses again. The linkage of N test bus terminals to P core scan chain input/output terminals for a corresponding core is completed by applying an instruction to the lowest input pin e0 of the N test bus terminals.

Such CAS-based TAM control technology is easy to reconfigure and is useful for performing a core internal test, a BIST and a core external test. However, the CAS-based TAM control technology is disadvantageous in that the structure of the CAS becomes complicated as the width of test buses and the number of core scan chains increase. The number of cases of selectively linking N test bus terminals to P scan chain input/output terminals in consideration of order is $_NP_P$ (N Permutation P), which should be supported by a CAS configuration instruction, so that the design of the CAS becomes very complicated. In actual linkage cases, when N is six and P is three, the number of cases of linkage is 120, the length of an instruction is 7 bits, and the area of a CAS circuit is 280 gates. When N is eight and P is four, the number of cases of linkage is 1680, the length of an instruction is 11 bits, and the area of a CAS circuit is 4400 gates. As described above, it can be understood that the length of an instruction and the area of a CAS circuit rapidly increase.

Such CAS is problematic in that it is difficult for the CAS to be applied to an actual commercial Application-Specific Integrated Circuit (ASIC) in which the number of scan chains is several tens or more and the total number of scan cells is several hundreds of thousands.

SUMMARY OF THE INVENTION

Accordingly, the present invention has been made keeping in mind the above problems occurring in the prior art, and an object of the present invention is to provide an improved TAM, which guarantees reconfiguration capability while minimizing hardware overhead by restricting the number of cases of linkage in consideration of the order of arrangement of pins when the test bus terminals of an SoC composed of IP cores are linked to the scan chain input/output terminals of an embedded core, thus make possible to perform various tests dynamically.

In order to accomplish the above object, the present invention provides an SoC-based core scan chain linkage switch, including test bus terminals for applying instructions and inputting/outputting test data; scan chain input/output terminals for linking with the scan chains of an embedded core; a switch unit for completing a linkage configuration between the test bus terminals and the scan chain input/output terminals in response to the applied instructions; and input terminals for SCLK, UCLK and Mode signals for applying the instructions to dynamically reconfigure the switch unit and updating the linkage configuration of the switch unit and an Enable signal for activating and deactivating the switch unit. The core scan chain linkage switch applies test data from the test bus terminals through the scan chain input terminals and outputs test results, through the scan chain output terminals.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

A preferred embodiment of the present invention is descried in detail with reference to the accompanying drawings below.

When linking N test bus terminals to P scan chain input terminals, the core scan chain linkage switch of the present invention considerably reduces the number of cases of linkage between pins to $(N-P+1)^P$ by restricting the linkage of each scan pin to (N−P+1) test pins in such a way as to link an upper scan pin to an upper test pin in consideration of the order of arrangement of pins, thereby significantly reducing complexity compared to the conventional CAS.

Figure 1:
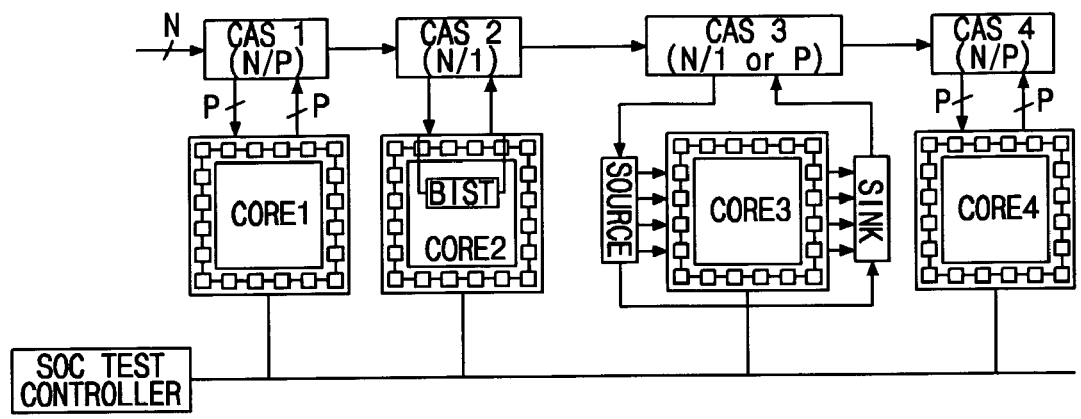
FIG. 1 is an example of various test functions that can be performed by a conventional CAS-BUS.
Figure 2:
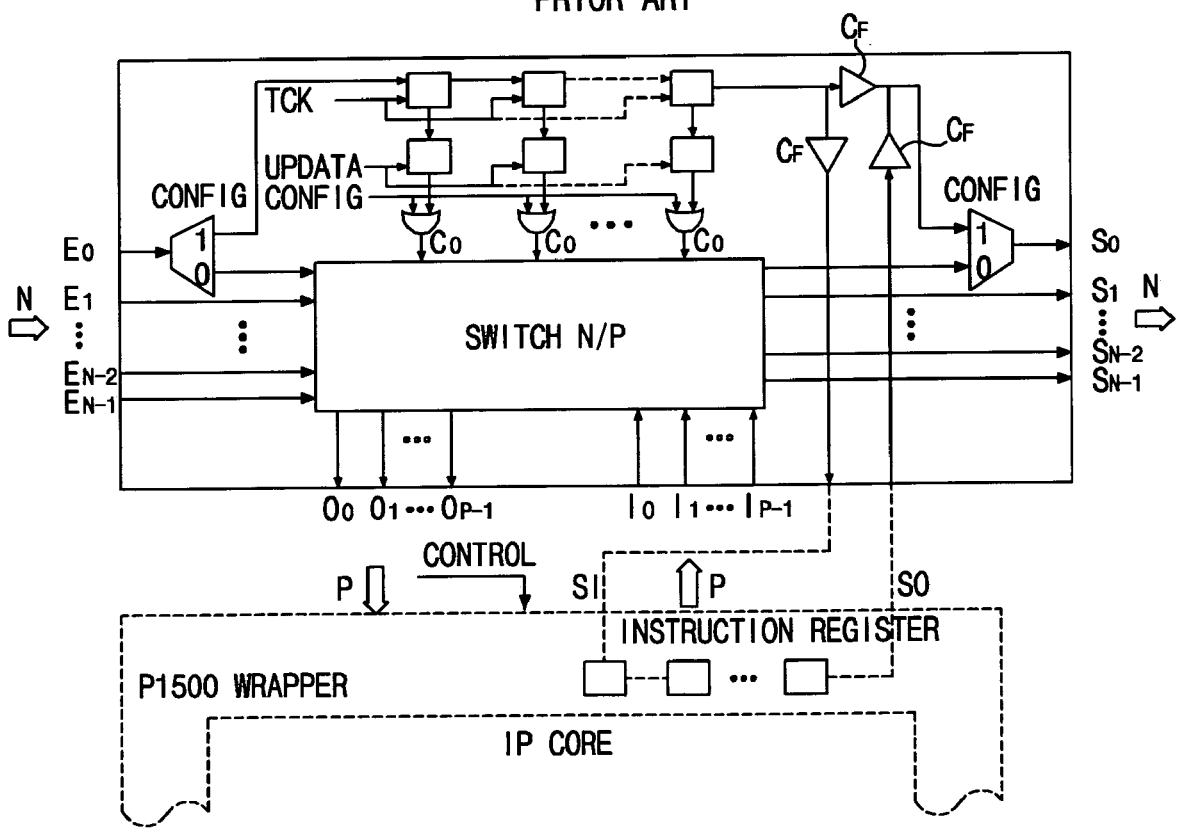
FIG. 2 is a configuration diagram showing the linkage of a CAS to an IP core surrounded by a P1500 wrapper.
Figure 3:
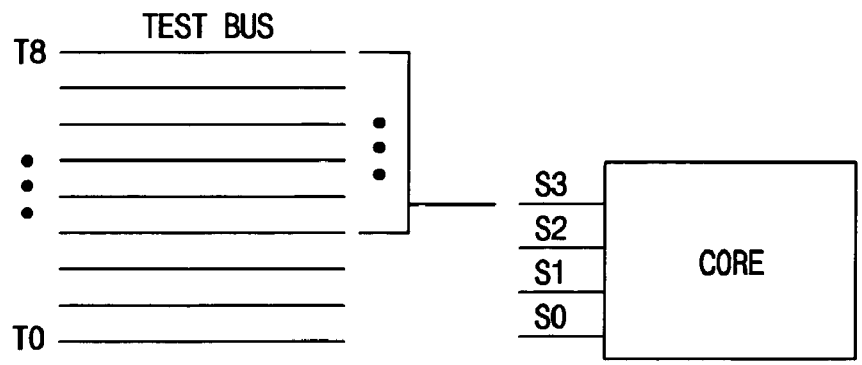
FIG. 3 is a diagram showing an example of restricting the reconfiguration range of a core scan chain linkage switch according to the present invention.

FIG. 3 is a diagram showing an example of restricting the reconfiguration range of the core scan chain linkage switch. As shown in FIG. 3, in the case where the number of test pins is nine and the number of scan pins is four, wiring can be optimized by analyzing design information after the arrangement of an SoC has been completed and restricting the linkage of the uppermost scan pin S3 to upper test pins T8~T3. When a scan pin S2, a scan pin S1 and a scan pin S0 are restricted to test pins T7~T2, test pins T6~T1 and test pins T5~T0, respectively, the number of cases where nine test pins and four scan pins are linked to each other is $(N-P+1)^P = (9-4+1)^4 = 6^4 = 1296$. In the case of using the conventional CAS, the number of cases of linkage is $_NP_P = _9P_4 = 3024$, and the length of an instruction register required for the representation of linkage information is 12.

Figure 4:
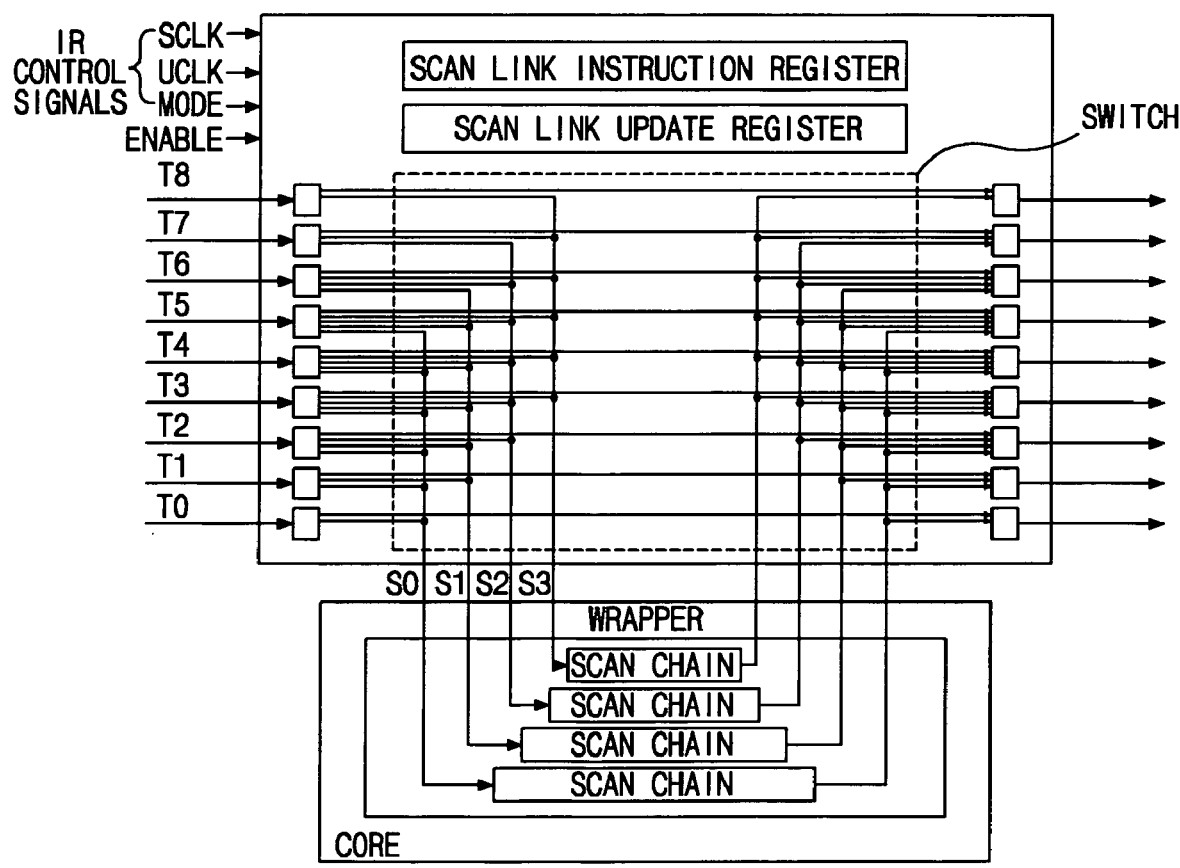
FIG. 4 is a diagram showing an example in which the core scan chain linkage switch of the present invention is linked to the scan chains of an embedded core.

FIG. 4 is a diagram showing an example in which the core scan chain linkage switch of the present invention is linked to the scan chains of an embedded core. A TAM that employs the core scan chain linkage switch of the present invention operates in three modes: Configuration mode, Bypass mode and Test mode.

The three modes are identified by combinations of Enable and Mode signals. To allow the TAM to operate in Configuration mode, '1' is applied as the Enable signal, and '1' is applied as Mode signal. In Configuration mode, the linkage configuration of the core scan chain linkage switch connected to the core is determined. When the SCLK signal is applied according to the length of an instruction while the instruction is input to the lower input pin T0 of test bus terminals, the instruction is received by the bit every SCLK clock and a scan link instruction register is filled with the instruction. A scan link update register is updated with the instruction stored in the scan link instruction register by applying the UCLK signal after inputting the entire instruction into the scan link instruction register. The linkage of the switch is constructed by the instruction of the scan link update register.

In the case where the Enable signal is '0', the TAM operates in Bypass mode regardless of the Mode signal, and all the pins of the test bus terminals pass through the switch without passing the scan chain input/output terminals and requiring clocks.

To allow the TAM to operate in Test mode, '1' is applied as the Enable signal, and '0' is applied as the Mode signal. In Test mode, tests are performed through the linkage configuration of the switch constructed by the instruction applied in Configuration mode, and tests, such as a scan, a BIST and a wrapper scan, are performed.

TABLE 1

Comparison of conventional CAS with core scan linkage switch of present invention

| | CAS | | Core scan linkage switch | |
|---|---|---|---|---|
| P | $_9P_P$ | n (bits) | $(9 - P + 1)^P$ | n (bits) |
| 3 | 504 | 9 | 343 | 9 |
| 4 | 3024 | 12 | 1296 | 11 |
| 5 | 15120 | 14 | 3125 | 12 |
| 6 | 60480 | 16 | 4096 | 12 |
| 7 | 181440 | 18 | 2187 | 12 |
| 8 | 362880 | 19 | 256 | 8 |

In Table 1, the conventional CAS is compared with the core scan linkage switch according to the present invention. Table 1 shows that the complexity of the core scan linkage switch according to the present invention is considerably reduced compared to that of the conventional CAS and, accordingly, the length of instructions is considerably reduced.

As described above, the present invention provides an SoC-based core scan chain linkage switch, which reduces complexity by restricting the number of cases of linkage in consideration of the order of arrangement of pins in the linkage between the test bus terminals of an SoC and the scan chain input/output terminals of an embedded core, so that it can be applied to an actual circuit and guarantees scalability and reconfiguration capability, thus making possible the internal tests of cores, a BIST, and the tests of hierarchical cores.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A System-on-a-Chip (SoC)-based core scan chain linkage switch, comprising:
    test bus terminals for applying instructions and inputting and outputting test data;
    scan chain input and output terminals for linking with scan chains of an embedded core;
    a switch unit for completing a linkage configuration between the test bus terminals and the scan chain input and output terminals in response to the applied instructions, by restricting the number of cases of the linkage in consideration of the order of arrangement of the test bus terminals; and
    input terminals for Mode and Enable signals for identifying operation modes of the core scan chain linkage switch, and predetermined clock signals.

2. The SoC-based core scan chain linkage switch of claim 1, further comprising:
    a scan link instruction register that receives the instructions from a test bus terminal, and is filled with the instructions; and
    a scan link update register that is updated with the instructions stored in the scan link instruction register, wherein the switch unit completes the linkage configuration between the test bus terminals and the scan chain input and output terminals in response to the instructions from the scan link update register.

* * * * *